United States Patent
Yang et al.

(10) Patent No.: US 6,596,568 B1
(45) Date of Patent: Jul. 22, 2003

(54) THIN FILM TRANSISTOR AND FABRICATING METHOD THEREOF

(75) Inventors: Joon-Young Yang, Seoul (KR); Ju-Cheon Yeo, Anyang-shi (KR)

(73) Assignee: LG.Philips LCD Co., Ltd., Seoul (KR)

(*) Notice: Subject to any disclaimer, the term of this patent is extended or adjusted under 35 U.S.C. 154(b) by 10 days.

(21) Appl. No.: 09/698,217

(22) Filed: Oct. 30, 2000

(30) Foreign Application Priority Data

Oct. 29, 1999 (KR) .................................. 1999-47530

(51) Int. Cl.$^7$ .......................... H01L 21/00; H01L 21/84
(52) U.S. Cl. ..................... 438/151; 438/154; 438/526
(58) Field of Search ................. 438/149, 151, 438/154, 526, 917

(56) References Cited

U.S. PATENT DOCUMENTS

| | | | |
|---|---|---|---|
| 4,128,439 A | * 12/1978 | Jambotkar | 148/1.5 |
| 4,338,616 A | * 7/1982 | Bol | 357/15 |
| 4,732,870 A | * 3/1988 | Mimura | 437/40 |
| 5,429,962 A | * 7/1995 | Yang | 437/40 |
| 5,808,344 A | * 9/1998 | Ismail et al. | 257/369 |
| 6,051,452 A | * 4/2000 | Shigyo et al. | 438/151 |

* cited by examiner

Primary Examiner—Amir Zarabian
Assistant Examiner—Pamela E Perkins
(74) Attorney, Agent, or Firm—McKenna Long & Aldridge LLP

(57) ABSTRACT

Thin film transistors and methods of fabricating thin film transistors having low OFF state leakage current. The OFF state leakage current reduction is achieved by using doping implantation energies such that the average penetration depth of the doping impurity into the semiconductor, the projected range Rp, is located below the surface of the semiconductor layer, and such that the concentration of impurities remaining at the surface of the semiconductor layer is relatively small.

9 Claims, 9 Drawing Sheets

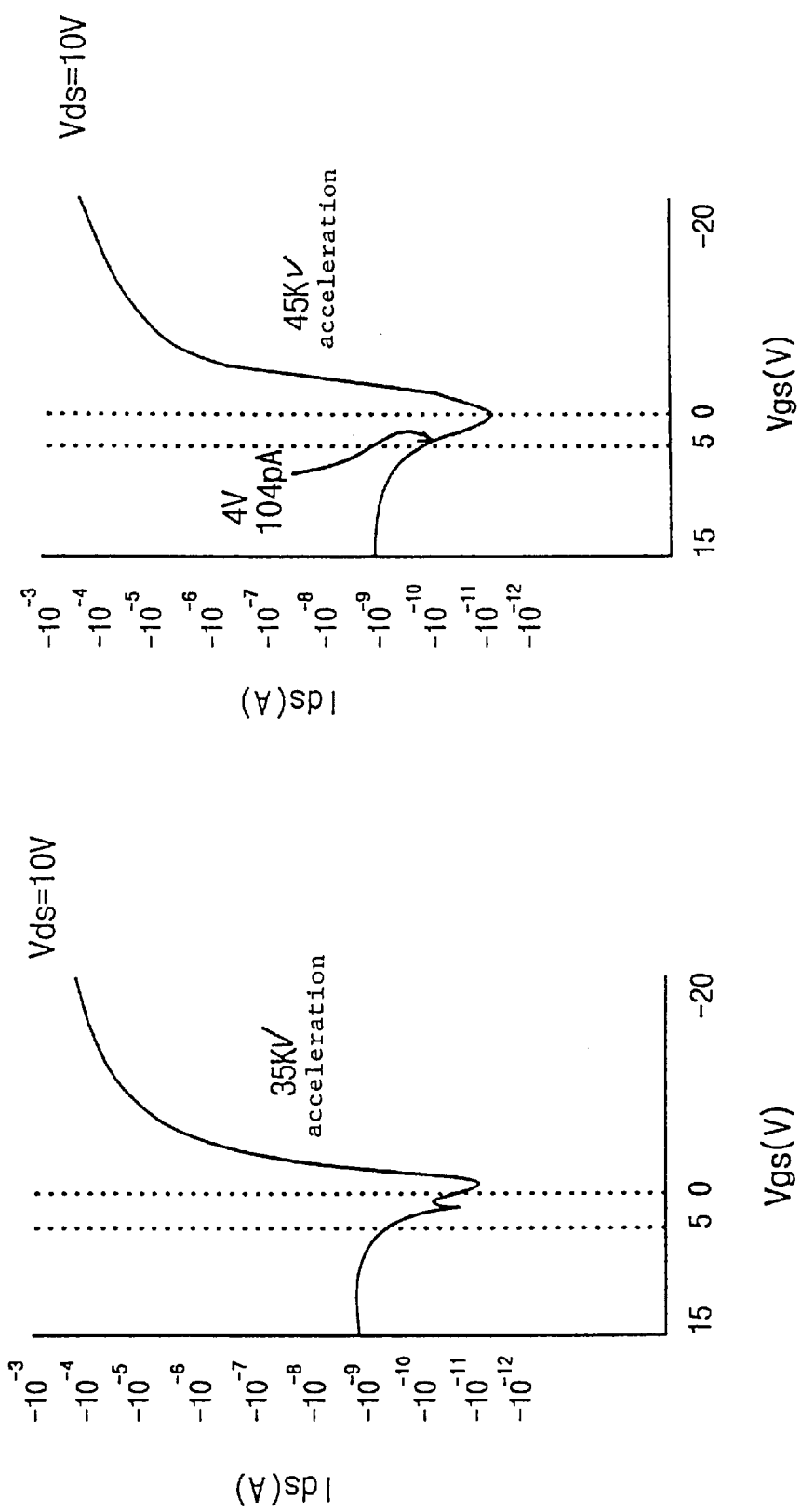

THIN FILM TRANSISTOR AND FABRICATING METHOD THEREOF

This application claims the benefit of Korean Patent Application No. 1999-47530, filed on Oct. 29, 1999, which is hereby incorporated by reference for all purposes as if fully set forth herein.

BACKGROUND OF THE INVENTION

1. Field of the Invention

The present invention relates to thin film transistors. More particularly, it relates to thin film transistors that are particularly useful as switching devices in liquid crystal displays, and to methods of fabricating such thin film transistors.

2. Discussion of the Related Art

Active layers of thin film transistors (hereinafter abbreviated TFTs) are formed on substrates. Such active layers include source and drain regions comprised of impurity doped materials and an undoped channel region. Impurity doping means that impurities are implanted into a substrate layer.

Impurities in source and drain regions tend to gather near the channel region when an ON signal is applied to a gate electrode located adjacent the active layer, thereby providing a path through which carriers can more easily pass.

To dope a semiconductor layer, doping impurities are accelerated using an acceleration voltage to kinetic energies in the range of 1 kV to 10 MV. The accelerated impurities are then directed onto a surface of a semiconductor. The accelerated impurities contact crystal lattices of the semiconductor and transfer their kinetic energy to those lattices. The doping impurities achieve an average penetration depth into the semiconductor that is referred to as the projected range (hereinafter abbreviated Rp).

While the projection range is a useful measure of the average penetration depth of the impurities, not every impurity locates at the projection range. Referring now to FIG. 1, doping impurities typically distribute with an impurity concentration profile that is almost symmetrically centering around the projected range Rp. The impurity concentration profile generally follows a Gaussian distribution having a maximum impurity concentration at Rp. FIG. 1 also illustrates a measure of a distributional deviation called ΔRp.

FIG. 2 and FIG. 3 present various illustrations of a related art TFT. FIG. 2 illustrates a cross-sectional view of that related art TFT, while FIG. 3 presents a graph of doping impurity concentration versus depth (into a semiconductor layer) of that related art TFT. Referring now to FIG. 2, a semiconductor layer 21 is formed on a buffer layer 20 that is over a substrate 200. Over the center of the semiconductor layer is a gate insulating layer 22 that is covered by a gate electrode 23. At one side of the semiconductor layer 21 is a source region 21S that is doped with impurities, while the other side of the semiconductor layer has a drain region 21D that is also doped with impurities. Below the gate insulating layer 22 is an undoped channel region 21C.

To fabricate the related art TFT illustrated in FIGS. 2 and 3, impurity doping is carried out by accelerating doping impurities such that Rp is located less than 100 Å from the surface of the semiconductor layer 21. Thus, the source and drain regions 21S and 21D are formed, as shown FIG. 3, by heavily doping the surface of the semiconductor layer 21 with impurities.

Unfortunately, TFTs according to FIGS. 2 and 3 tend to have high leakage currents due to the high doping impurity concentrations at or near-the surface of the semiconductor layer when the TFT is in the OFF state. This leakage current is produced by current flow generated by carriers in the drain region when an electric field exists between the drain and gate electrode when the TFT is OFF. One approach to the problem of high leakage current is to incorporate an offset region between the gate and drain to reduce the electric field, the so-called lightly-doped-drain (LDD) structure. However, lightly-doped-drain TFTs usually require relatively complicated fabrication processes that include additional photo-masking and impurity doping steps to form the offset regions.

Moreover, TFTs according to FIGS. 2 and 3 also have relatively high leakage current because of contaminants that cross the interface between the semiconductor layer and the buffer layer during the fabrication of the TFT.

Therefore, an improved thin film transistor, and a method of fabricating such a thin film transistor, having decreased leakage current would be beneficial.

SUMMARY OF THE INVENTION

Accordingly, the present invention is directed to thin film transistors, and methods of fabricating such thin film transistors, that reduce the leakage current problems found in the related art.

An object of the present invention is to provide a thin film transistor, and a fabricating method thereof, having decreased leakage current achieved by reducing the electric field from the boundary of the drain region when an OFF voltage is applied, wherein the electric field is reduced by a doping step wherein impurities having a generally Gaussian distribution are formed such that the projection range Rp is located away from the surface of the semiconductor layer, and by having the impurities that remain at the surface of the semiconductor layer at a predetermined concentration which is relatively small.

Another object of the present invention is to provide a thin film transistor and a fabricating method thereof which has a small source/drain resistance produced by increasing the depth of Rp so as to reduce the surface impurities concentration, while maintaining the impurities above a predetermined level.

A further object of the present invention is to provide a thin film transistor and a fabricating method thereof which prevents contaminants from acting as a source of back channel current by compensating the amount of contaminants penetrating between a buffer layer and a semiconductor layer during the fabrication of a TFT by controlling the doping condition so as to have Rp located near or in the buffer layer.

Additional features and advantages of the present invention will be set forth in the description that follows, and in part will be apparent from that description and/or the drawings, or may be learned by practice of the invention. The objectives and other advantages of the present invention will be realized and attained by the structure discussed in the description and in the claims, as well as in the drawings.

To achieve these and other advantages of the present invention, as embodied and broadly described herein, there is provided a thin film transistor having a semiconductor layer having source and drain regions defined by doped impurities, a gate insulating layer and a gate electrode, wherein the impurities in the source and drain regions are implanted into the semiconductor layer such that the resulting impurity concentration profile has a projected range Rp at a depth that is away from the surface of the semiconductor layer, and wherein the impurities are distributed so as not to have a maximum concentration at the surface of the semiconductor layer.

In another aspect, the present invention relates to a method of fabricating a thin film transistor having a semiconductor layer with source, drain, and channel regions, a gate insulating layer over the semiconductor layer, and a gate electrode over the gate insulating layer. Those source and drain regions are defined by impurity doping the semiconductor layer, with the impurity doping carried out by setting doping impurity kinetic energies such that the doping impurities distribute into the semiconductor layer such that they do not have a maximum concentration at the surface of the semiconductor layer, and such that the impurities are implanted into the semiconductor layer so as to have a projected range Rp that is located at a depth that is away from the surface of the semiconductor layer.

In another aspect, the present invention relates to fabricating a thin film transistor having a buffer layer, a semiconductor layer on that buffer layer, a gate insulating layer over the semiconductor, and a gate electrode over the gate insulating layer. That semiconductor layer includes source and drain regions that are defined by impurity doping the semiconductor layer, wherein the impurity doping is carried out by setting doping impurity kinetic energies such that the impurities distribute into the semiconductor layer such that they are implanted into the semiconductor layer so as to have a projected range Rp located at a depth that is away from the surface of the semiconductor layer, and such that the impurity concentration at the surface of the semiconductor layer is less that the impurity concentration at the interface between the semiconductor layer and the buffer layer.

It is to be understood that both the foregoing general description and the following detailed description are exemplary and explanatory and are intended to provide further explanation of the invention as claimed.

BRIEF DESCRIPTION OF THE DRAWING

The accompanying drawings are included to provide a further understanding of the invention, are incorporated into and constitute a part of this specification, illustrate embodiments of the invention, and, together with the description, serve to illustrate the principles of the invention.

In the drawings:

FIG. 7A to FIG. 7D show graphs of the transfer curves of TFTs fabricated using various impurity acceleration voltages.

DETAILED DESCRIPTION OF ILLUSTRATED EMBODIMENTS

Reference will now be made in detail to illustrated embodiments of the present invention.

Figure 4:
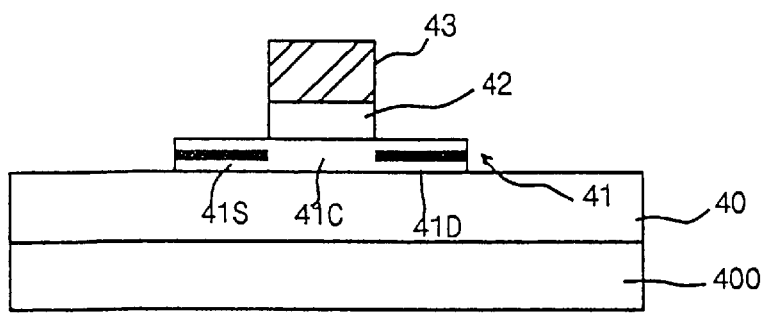
FIG. 4 illustrates a cross-sectional view of a TFT according to the principles of the present invention.
Figure 5:
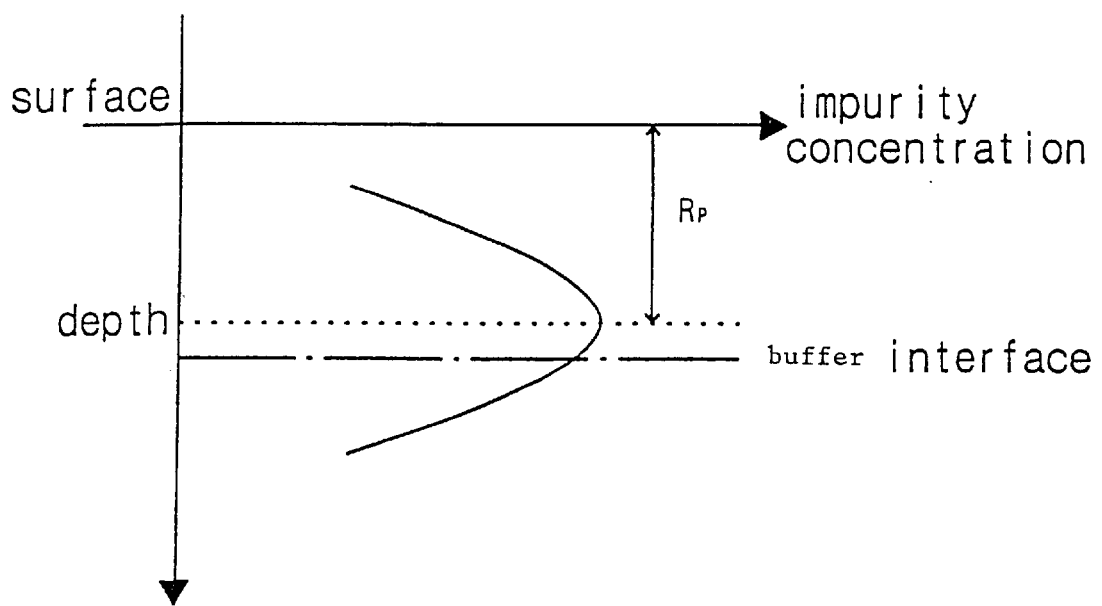
FIG. 5 is a graph of the impurity concentration of the TFT illustrated in FIG. 4.
Figure 6B:
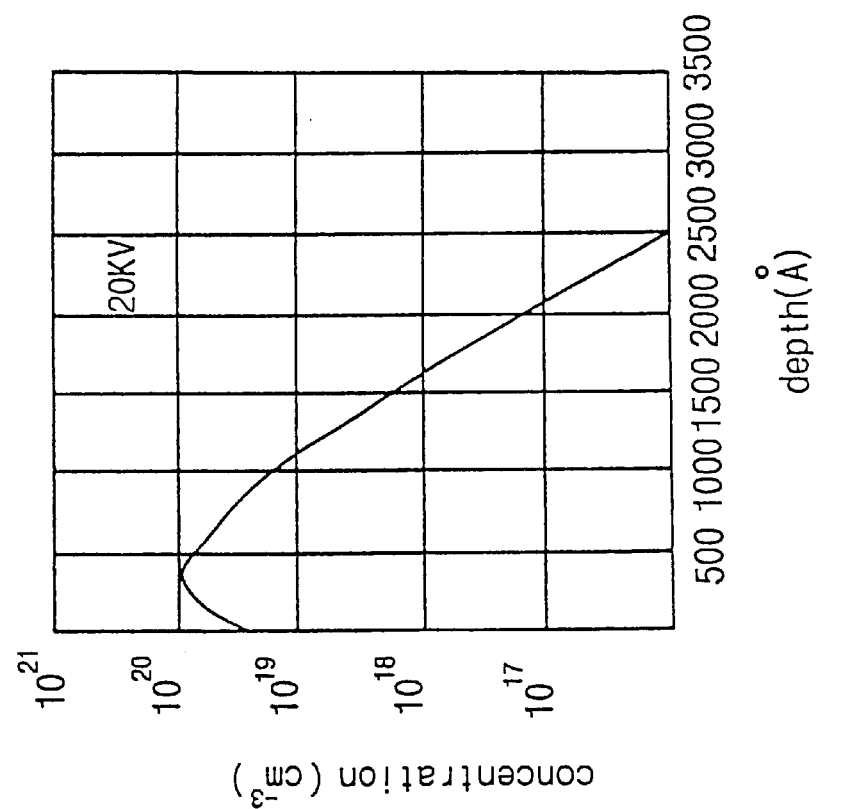
FIG. 6A to FIG. 6H show graphs of doping impurity concentrations verses depth for various impurity acceleration voltages.
Figure 6A:
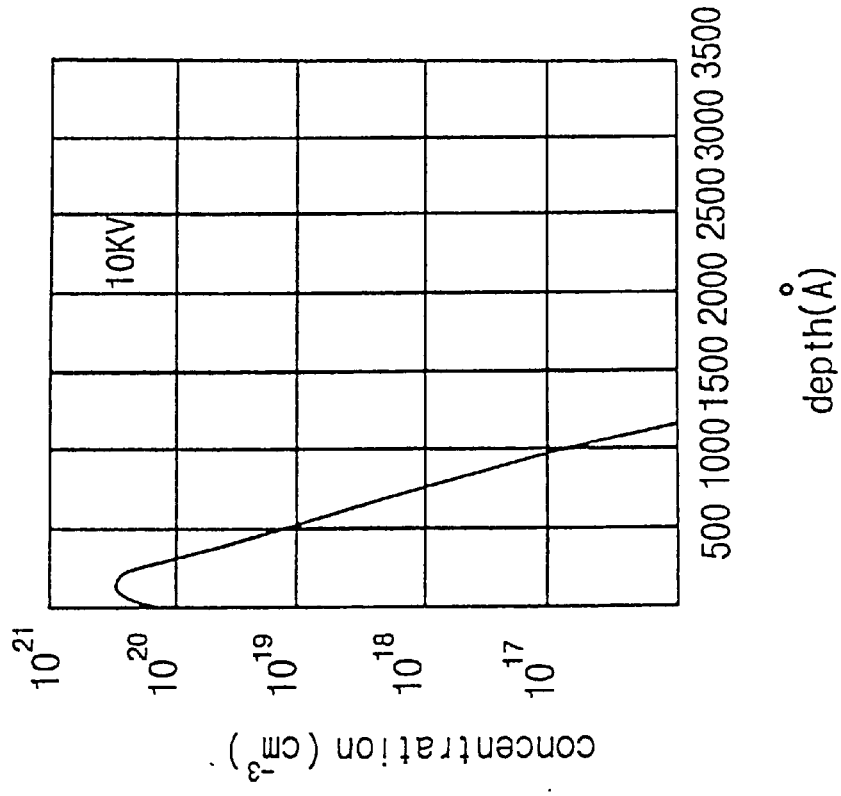
Figure 6D:
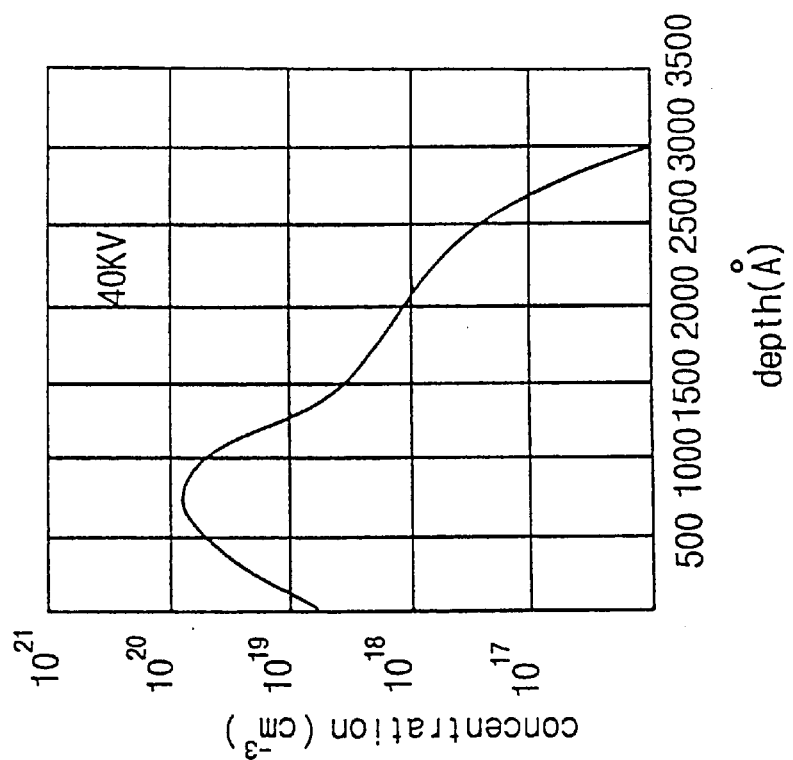
Figure 6C:
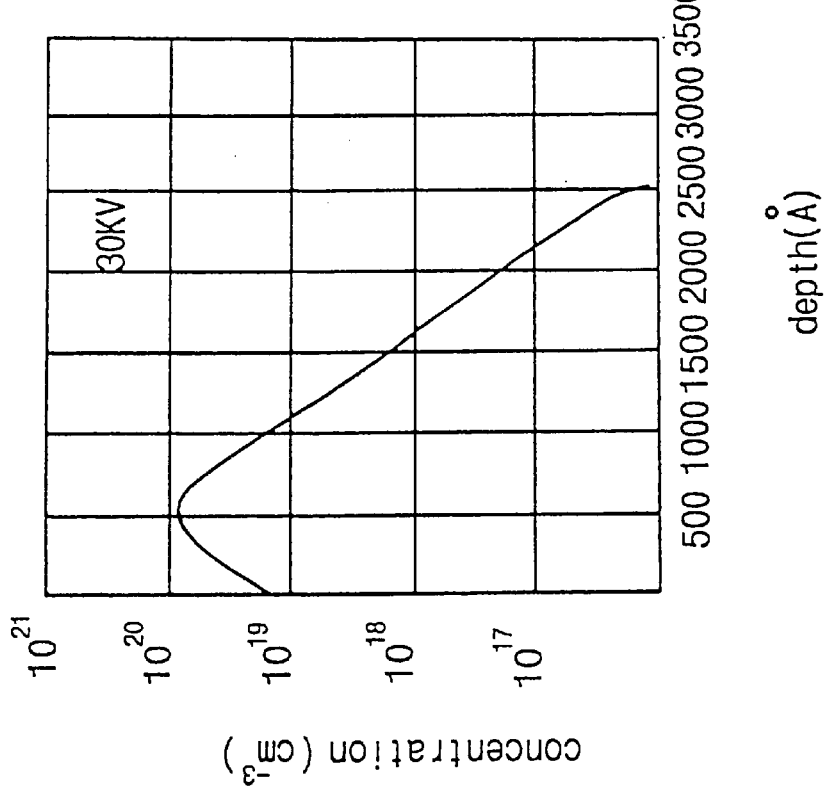
Figure 6E:
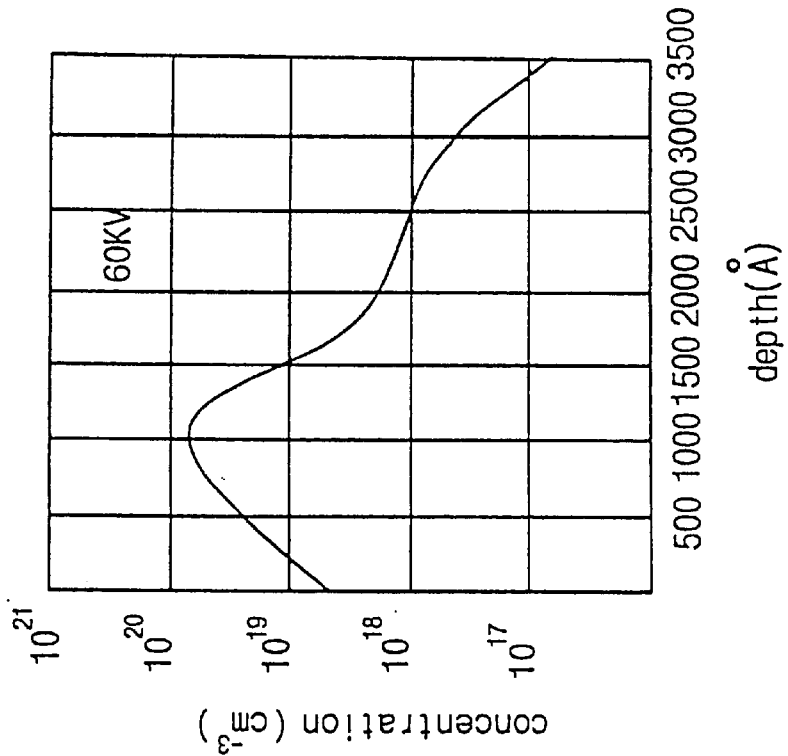
Figure 6F:
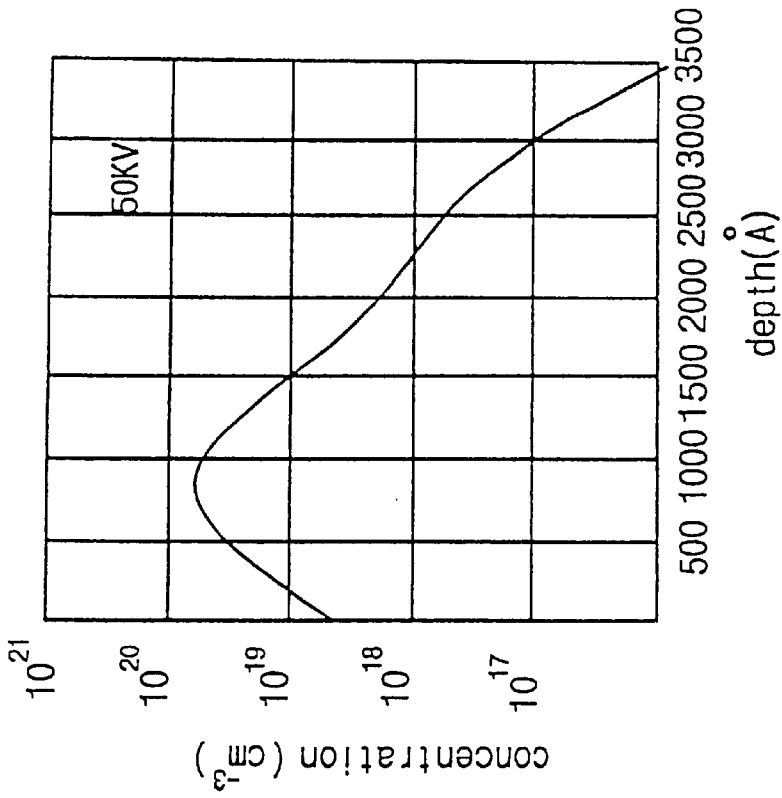
Figure 6H:
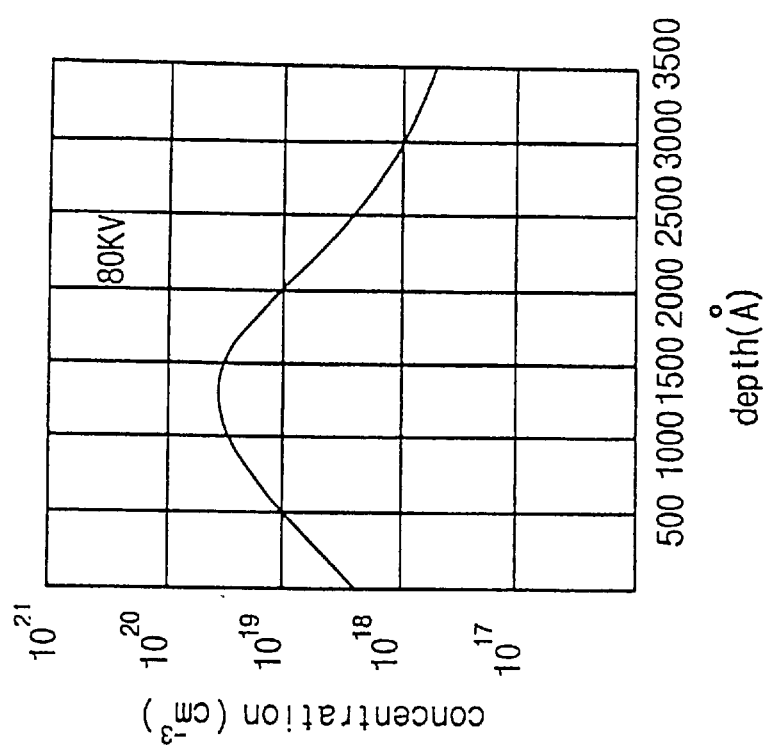
Figure 6G:
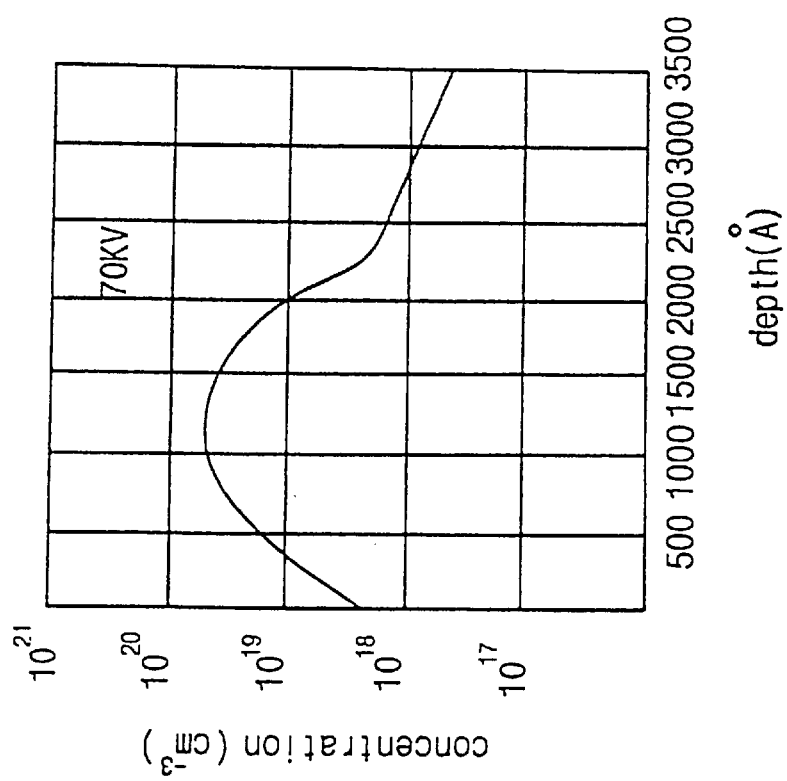
Figure 7A:
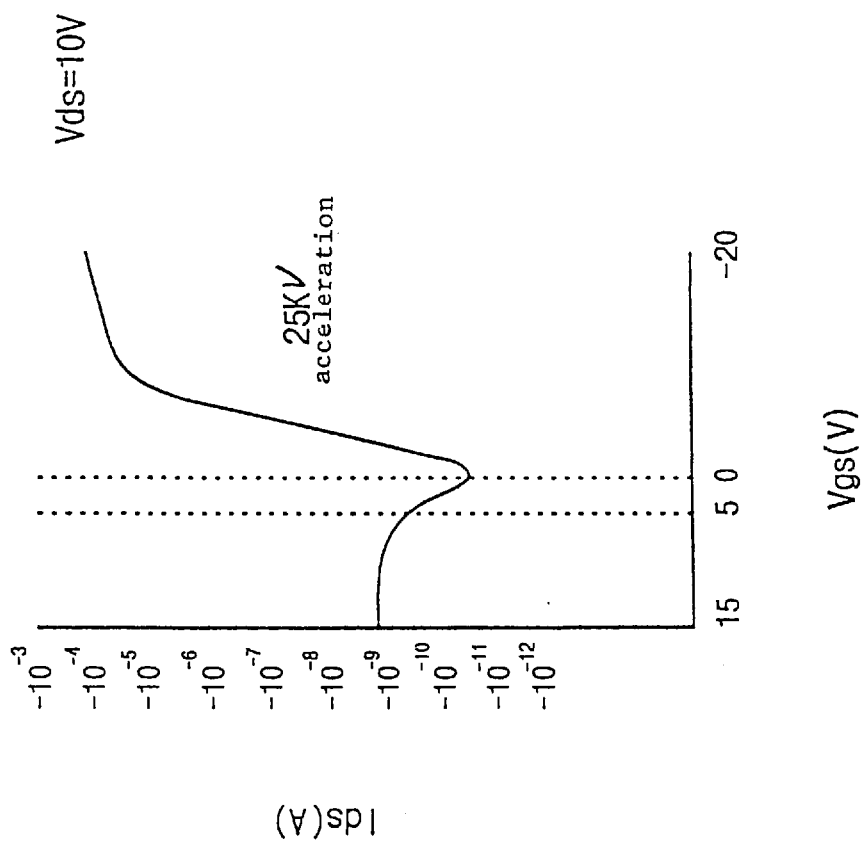
Figure 7B:
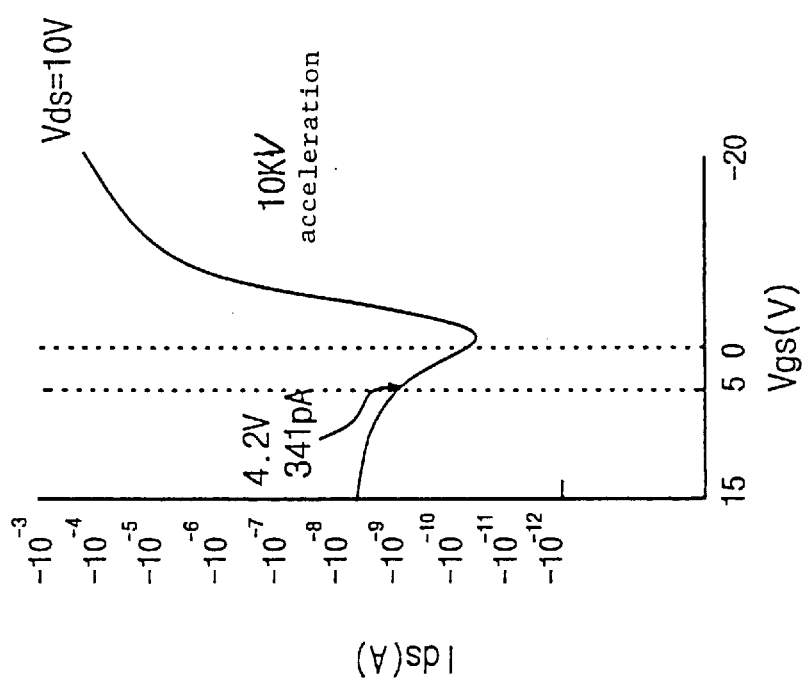

FIG. 4 and FIG. 5 present various illustrations of a TFT that is in accord with the principles of present invention. FIG. 4 illustrates a cross-sectional view of that TFT, while FIG. 5 presents a graph of doping impurity concentration verses depth (into a semiconductor layer) of that TFT. Referring now to FIG. 4, a semiconductor layer 41 is formed on a buffer layer 40 that is over a substrate 400. Over the center of the semiconductor layer 41 is a gate insulating layer 42 and a gate electrode 43. At one side of the semiconductor layer 41 is a source region 41S that is doped with impurities, while the other side of the semiconductor layer has a drain region 41D that is also doped with impurities. Below the gate insulating layer 42 is an undoped channel region 41C. Generally, the semiconductor layer 41 is doped with impurities by using the gate electrode 43 as a mask.

As previously mentioned, doping impurities within a semiconductor layer typically follow a Gaussian distribution. As the acceleration voltage applied to the doping particles increases, so does the distribution deviation $\Delta Rp$. Thus, it is possible to adjust the impurity concentration at various locations within the semiconductor layer by adjusting the acceleration voltage. This enables the manipulation of Rp and the doping concentration of impurities.

In the present invention, as shown in the FIG. 5, impurity doping is carried out so as to locate Rp away from the surface of the semiconductor layer 41. Indeed, it is beneficial to locate Rp below the middle of the semiconductor layer. For example, it is beneficial to locate Rp 500 Å to 1000 Å below the top surface of the semiconductor layer when the semiconductor layer has a thickness between 900 Å to 1800 Å. Thus, the location of Rp, as shown in FIG. 5, is controlled so as to be well-below the surface of the semiconductor layer 41. Furthermore, doping is also controlled such that the impurity concentration near the surface of the semiconductor layer 41 is at a predetermined concentration, which, while depending on process conditions, is generally lower than $10_{18}$–$10^{20}/cm^3$.

As shown in FIG. 5, the doping can be carried out such that the doping impurity concentration at the interface between the semiconductor layer 41 and the buffer layer 40 is actually higher than the doping impurity concentration at the surface of the semiconductor layer 41. For instance, the impurity concentration at the interface between the semiconductor layer 41 and the buffer layer 40 may be greater than $10^{19}/cm^3$ while the impurity concentration at the surface of the semiconductor layer may be less than $10^{19}/cm^3$.

Figure 1:
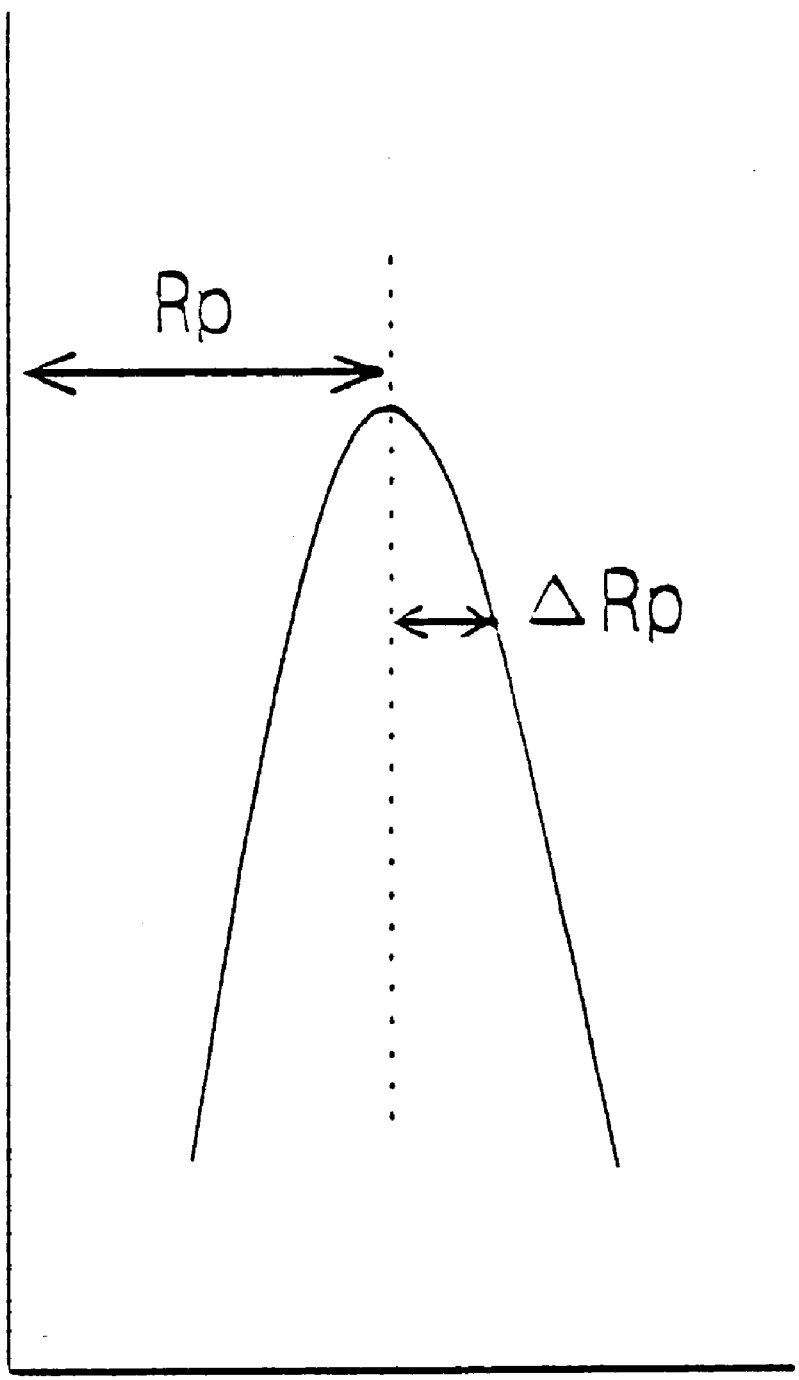
FIG. 1 is a graph of a Gaussian distribution of doping impurities.
Figure 2:
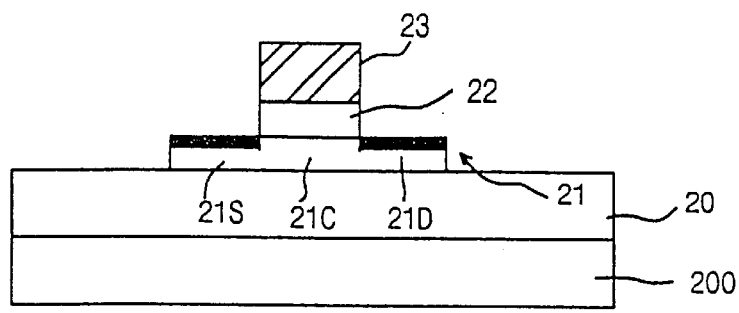
FIG. 2 illustrates a cross-sectional view of a prior art TFT that is doped with impurities according to a related art.
Figure 3:
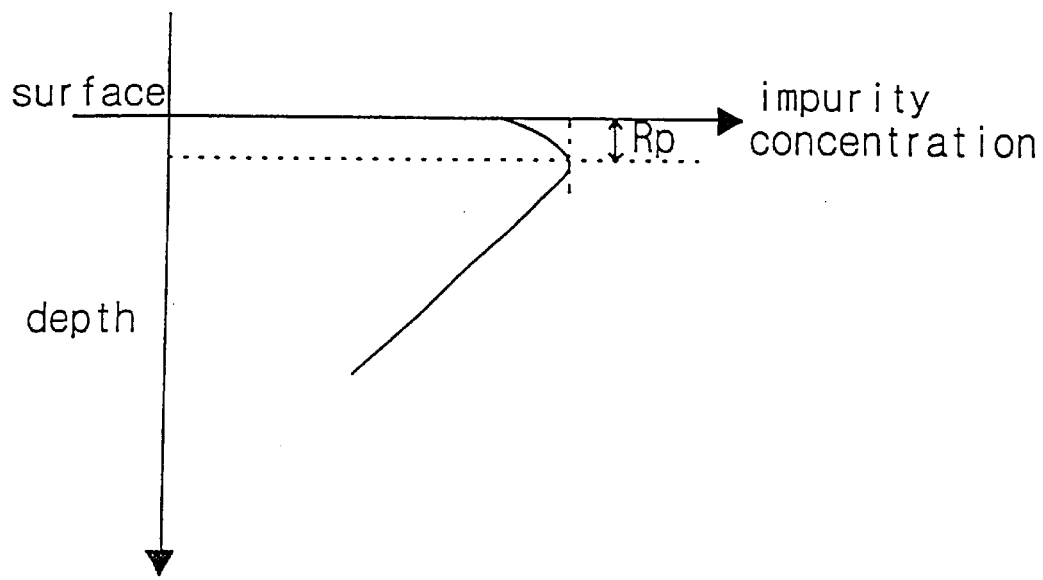
FIG. 3 presents a graph of the doping impurity concentration of the TFT illustrated in FIG. 2.

A TFT that is in accord with the principles of the present invention can have less leakage current when an OFF voltage is appled to it than the TFT illustrated in FIGS. 2 and 3. This is believed to be because a TFT according to the present invention has fewer impurities remaining at the surface of the semiconductor layer to impact the electric field near the drain region when the OFF voltage is applied.

Furthermore, the principles of the present invention prevent contaminants from aiding back channel current. This is achieved by compensating for the contaminants penetrating the interface between the buffer layer and the semiconductor layer by controlling the doping conditions to locate Rp at or near the buffer layer.

The principles of the present invention have been verified. For example, FIGS. 6A to 6H present graphs of doping impurity concentrations versus depth in a semiconductor layer as doping impurity acceleration voltages are changed. In the illustrated Figures the doping impurity is boron having a dose set to $2\times10^{15}/cm^2$. The graphs illustrate doping impurity concentrations versus depth using impurity acceleration voltages of 10 kV, 20 Kv, 30 kV, 40 kV, 50 kV, 60 kV, 70 kV and 80 kV respectively.

As shown in the FIGS. 6A to 6H, the larger the acceleration energy becomes, the deeper Rp becomes. Additionally, when impurity doping is carried out at the same dose, the impurity concentration at the surface of the semiconductor layer varies in accordance with the location of Rp. Therefore, the principles of the present invention enable one to control the doping impurity concentration at various depths below the surface of the semiconductor layer by manipulating Rp and the doping concentration of the impurity.

FIGS. 7A to 7D present transfer curves of TFTs that are in accordance with the principles of the present invention. Specifically, those graphs are of p type TFTs, wherein boron having a dose set to $3 \times 10^5/cm^2$ is used as the doping impurity, and in which doping impurity acceleration voltages of 10 kV, 25 kV, 35 kV and 45 kV, respectively, are used.

As shown in FIGS. 7A to 7D, leakage current when an OFF voltage is applied is generally reduced as the impurity acceleration voltage increases. For example, a TFT fabricated by doping using a doping impurity acceleration voltage of 10 KV has an OFF current of 341 pA with an OFF gate voltage of 4.2V. In contrast, a similar TFT fabricated by impurity doping at an impurity acceleration voltage of 45 kV, provides an OFF current of 104 pA stet OFF gate voltage of 4V. This is a reduction in leakage current of 67.5%.

The results imply that the OFF current is reduced as a result of a decreased electric field near the boundary of the drain region during the OFF state. The above results also indicate that the OFF current is reduced by a decrease in the electric field between the gate and the drain during the OFF state when the surface of the semiconductor layer is doped lightly with impurities. Moreover, the results further indicate that boron ions implanted so as to locate Rp near the buffer layer/semiconductive layer interface enables the reduction of a "backside current source" generated by contaminates that cross the interface during the fabrication of a TFT. Furthermore, although the illustated test results relate to p type TFTs doped with boron ions, the principles of the present invention do not depend on the specific structure illustrated or to the conductive type of TFT. For example, OFF current reduction is also present in dual gate structures that are in accord with the principles of the present invention.

As mentioned in the above description, the present invention enables the reduction in OFF current by controlling the doping implantation energy during the fabrication of a TFT of a general structure.

Accordingly, the principles of the present invention enables a reduction in OFF state leakage current without introducing a lightly-doped-drain structure.

TFTs used as switching devices in liquid crystal displays will particularly benefit from the principles of the present invention.

It will be apparent to those skilled in the art that various modifications and variation can be made in the present invention without departing from the spirit or scope of the invention. Thus, it is intended that the present invention covers the modifications and variations of this invention provided they come within the scope of the appended claims and their equivalents.

What is claimed is:

1. A method of fabricating a thin film transistor, comprising:

depositing a semiconductor layer having a predetermined thickness on a substrate;

forming a gate insulation layer on the semiconductor layer;

forming a gate electrode on the gate insulation layer; and forming a source region and a drain region by doping impurities, the source and drain regions having a doping impurity concentration profile with a projected range Rp, wherein the value of said Rp is larger than five-eighteenths of said predetermined thickness of said semiconductor layer.

2. The method of fabricating a thin film transistor according to claim 1, wherein said projected range Rp is more than 500 Å below said the surface of said semiconductor layer.

3. The method of fabricating a thin film transistor according to claim 1, wherein said doping induces impurities at the surface of said semiconductor layer with an impurity concentration less than $10^{20}/cm^3$.

4. The method of fabricating a thin film transistor according to claim 3, wherein said doping induces impurities at the surface of said semiconductor layer with an impurity concentration less than $10^{18}/cm^3$.

5. A method of fabricating a thin film transistor, comprising:

forming a buffer layer on a substrate;

forming a semiconductor layer having a predetermined thickness on the buffer layer;

forming a gate insulation layer on the semiconductor layer;

forming a gate electrode on the gate insulation layer; and forming a source region and a drain region by doping impurities, the source and drain regions having a doping impurity concentration, wherein the doping impurity concentration at the interface between said buffer layer and said semiconductor layer is higher than the doping impurity concentration at the surface of said semiconductor layer.

6. The method of fabricating a thin film transistor according to claim 5, wherein said projected range Rp is more than 500 Å below the surface of said semiconductor layer.

7. The method of fabricating a thin film transistor according to claim 5, wherein said projected range Rp is in said buffer layer.

8. The method of fabricating a thin film transistor according to claim 5, wherein said doping induces impurities at the surface of said semiconductor layer with a concentration less than $10^{20}/cm^3$.

9. The method of fabricating a thin film transistor according to claim 8, wherein said doping induces impurities at the surface of said semiconductor layer with a concentration less than $10^{18}/cm^3$.

* * * * *